US011249398B2

(12) United States Patent
Sakakibara et al.

(10) Patent No.: US 11,249,398 B2
(45) Date of Patent: Feb. 15, 2022

(54) METHOD FOR PRODUCING PLATED SHAPED STRUCTURE AND PHOTOSENSITIVE RESIN COMPOSITION FOR PRODUCTION OF PLATED SHAPED STRUCTURES

(71) Applicant: JSR CORPORATION, Tokyo (JP)

(72) Inventors: Hirokazu Sakakibara, Tokyo (JP); Hirokazu Itou, Tokyo (JP); Tomoyuki Matsumoto, Tokyo (JP); Kazuto Watanabe, Tokyo (JP)

(73) Assignee: JSR CORPORATION, Tokyo (JP)

( * ) Notice: Subject to any disclaimer, the term of this patent is extended or adjusted under 35 U.S.C. 154(b) by 64 days.

(21) Appl. No.: 16/560,020

(22) Filed: Sep. 4, 2019

(65) Prior Publication Data

US 2019/0391489 A1    Dec. 26, 2019

Related U.S. Application Data

(63) Continuation of application No. PCT/JP2018/001058, filed on Jan. 16, 2018.

(30) Foreign Application Priority Data

Mar. 9, 2017  (JP) .............................. JP2017-045401

(51) Int. Cl.
*G03F 7/20* (2006.01)
*G03F 7/004* (2006.01)
*G03F 7/027* (2006.01)
*G03F 7/09* (2006.01)

(52) U.S. Cl.
CPC .......... *G03F 7/2002* (2013.01); *G03F 7/0045* (2013.01); *G03F 7/027* (2013.01); *G03F 7/09* (2013.01); *G03F 7/2022* (2013.01)

(58) Field of Classification Search
None
See application file for complete search history.

(56) References Cited

U.S. PATENT DOCUMENTS

| 2003/0136763 A1* | 7/2003 | Nakagawa ............... C09G 1/02 216/83 |
| 2005/0095527 A1* | 5/2005 | Yokoyama ............ G03F 7/0392 430/270.1 |
| 2012/0129104 A1 | 5/2012 | Aqad et al. |
| 2015/0338736 A1 | 11/2015 | Kawabata et al. |

FOREIGN PATENT DOCUMENTS

| JP | 2006-145853 A | 6/2006 |
| JP | 2007-272087 A | 10/2007 |
| JP | 2010-091691 A | 4/2010 |
| JP | 2012-111753 A | 6/2012 |
| JP | 2014-126767 A | 7/2014 |
| JP | 2016-042161 A | 3/2016 |
| JP | WO 2016/158362 A1 | 10/2016 |

OTHER PUBLICATIONS

International Search Report & Written Opinion dated Apr. 17, 2018, in International Application No. PCT/JP2018/001058 (w/ English translation of ISR).

Office Action dated Aug. 3, 2021, in the corresponding Japanese application No. 2019-504356 (with English machine translation).

* cited by examiner

*Primary Examiner* — Kathleen Duda

(74) *Attorney, Agent, or Firm* — Oblon, McClelland, Maier & Neustadt, L.L.P.

(57) ABSTRACT

A method for producing a plated shaped structure, includes applying a photosensitive resin composition on a substrate to form a photosensitive resin coating film. The photosensitive resin composition includes: (A) a resin whose solubility in alkali is capable of being increased by an action of an acid; (B) a photoacid generator; and (C) a compound which is capable of being decomposed by an action of an acid to form a primary or secondary amine. The photosensitive resin coating film is exposed to light. The photosensitive resin coating film is developed after the exposing to light to form a resist pattern. A plating process is performed using the resist pattern as a mask.

10 Claims, 1 Drawing Sheet

|  | EXAMPLE 1B | COMPARATIVE EXAMPLE 1B |
|---|---|---|
| AFTER SULFURIC ACID TREATMENT |  | 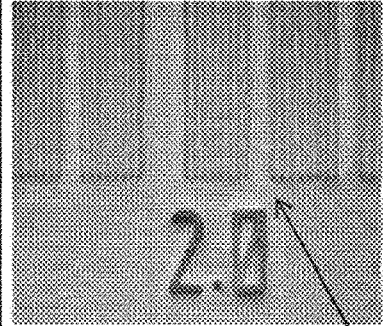 INFILTRATION BY SULFURIC ACID IMMERSION |
| AFTER RESIST STRIPPING | 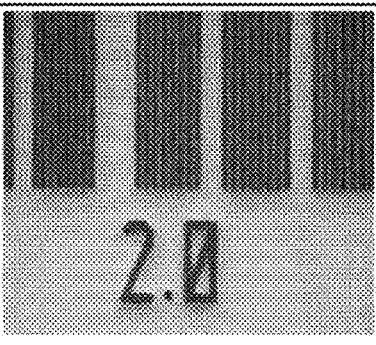 | 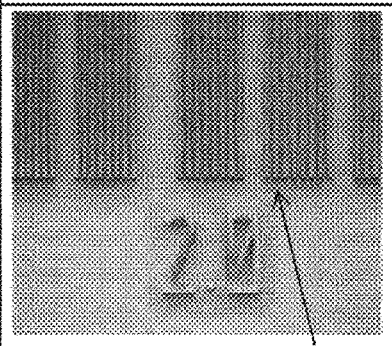 PLATING GROWS ON RESIST BOTTOM |

# METHOD FOR PRODUCING PLATED SHAPED STRUCTURE AND PHOTOSENSITIVE RESIN COMPOSITION FOR PRODUCTION OF PLATED SHAPED STRUCTURES

CROSS-REFERENCE TO RELATED APPLICATIONS

The present application is a continuation application of International Application No. PCT/JP2018/001058, filed Jan. 16, 2018, which claims priority to Japanese Patent Application No. 2017-045401, filed Mar. 9, 2017. The contents of these applications are incorporated herein by reference in their entirety.

BACKGROUND OF THE INVENTION

Technical Field

The present invention relates to a method for producing a plated shaped structure and a photosensitive resin composition for production of plated shaped structures.

Background Art

In recent years, the demand for mounting connection terminals such as wirings and bumps of semiconductor elements and display elements such as liquid crystal displays and touch panels at high density has increased, and therefore the miniaturization thereof is in progress. Along with this, miniaturization is also required for resist patterns used for forming wirings, bumps, and the like.

In general, a plated shaped structure such as a wiring or a bump is formed by forming a resist pattern on a substrate having a metal foil such as copper foil and performing a plating process using the resist pattern as a mask (JP-A 2007-272087 and JP-A 2006-145853).

SUMMARY OF THE INVENTION

According to an aspect of the present invention, a method for producing a plated shaped structure includes applying a photosensitive resin composition on a substrate to form a photosensitive resin coating film. The photosensitive resin composition includes: (A) a resin whose solubility in alkali is capable of being increased by an action of an acid; (B) a photoacid generator; and (C) a compound which is capable of being decomposed by an action of an acid to form a primary or secondary amine. The photosensitive resin coating film is exposed to light. The photosensitive resin coating film is developed after the exposing to light to form a resist pattern. A plating process is performed using the resist pattern as a mask.

According to another aspect of the present invention, a photosensitive resin composition includes: (A) a resin whose solubility in alkali is capable of being increased by an action of an acid; (B) a photoacid generator; and (C) a compound which is capable of being decomposed by an action of an acid to form a primary or secondary amine.

BRIEF DESCRIPTION OF THE DRAWINGS

The FIGURE is electron micrographs of a gold-plated shaped structure according to Example 1B, and a resist pattern after sulfuric acid treatment and a gold-plated shaped structure according to Comparative Example 1B.

DESCRIPTION OF EMBODIMENTS

The embodiments of the present invention are as follows.
[1] A method for producing a plated shaped structure, comprising:
a step (1) of forming, on a substrate, a photosensitive resin coating film of a photosensitive resin composition comprising (A) a resin whose solubility in alkali is increased by an action of an acid, (B) a photoacid generator, and (C) a compound which is decomposed by an action of an acid to form a primary or secondary amine;
a step (2) of exposing the photosensitive resin coating film to light;
a step (3) of developing the photosensitive resin coating film after light exposure to form a resist pattern; and
a step (4) of performing a plating process using the resist pattern as a mask.
[2] The method for producing a plated shaped structure according to [1] above, wherein the resin (A) is a resin having a phenolic hydroxyl group.
[3] The method for producing a plated shaped structure according to [1] or [2] above, wherein the compound (C) is an alkoxycarbonylated amine.
[4] The method for producing a plated shaped structure according to claim [3], wherein the alkoxycarbonylated amine is an isopentaoxycarbonylated amine.
[5] The method for producing a plated shaped structure according to any one of [1] to [4] above, wherein the plating process is a copper plating process using copper sulfate.
[6] The method for producing a plated shaped structure according to any one of [1] to [5] above, further comprising a step (5) of removing the resist pattern.
[7] A photosensitive resin composition for producing a plated shaped structure, comprising: (A) a resin whose solubility in alkali is increased by an action of an acid, (B) a photoacid generator, and (C) a compound which is decomposed by an action of an acid to form a primary or secondary amine.

According to the embodiments of the method for producing a plated shaped structure of the present invention, a resist pattern is formed on a substrate using a specific photosensitive resin composition, thereby making it possible to sufficiently suppress penetration of a plating solution (infusion of a plating material) into an interface between the substrate and the resist during the plating process. Therefore, it is possible to easily produce a plated shaped structure required to be more finely processed. In particular, when the plating process is a copper plating process or a nickel plating process, the infusion of the plating material can be sufficiently suppressed.

Moreover, the embodiment of the photosensitive resin composition for production of plated shaped structures of the present invention makes it possible to easily form a resist capable of suppressing the infusion of a plating material on a substrate. Therefore, it can be used suitably for formation of the resist pattern in the method for producing a plated shaped structure.

Hereinafter, a method for producing a plated shaped structure and a photosensitive resin composition for production of plated shaped structures according to the present invention will be described in detail.
1. Method for Producing Plated Shaped Structure A production method of a plated shaped structure is characterized by including a step (1) of forming, on a substrate, a photosensitive resin coating film of a photosensitive resin composition comprising (A) a resin whose solubility in alkali is increased by an action of an acid, (B) a photoacid generator, and (C) a compound which is decomposed by an action of an acid to form a primary or secondary amine, a step (2) of exposing the photosensitive resin coating film to light, a step (3) of developing the photosensitive resin coating film after light exposure to form a resist pattern, and a step (4) of performing a plating process using the resist pattern as a mask.

[Step (1)]

The step (1) is a step for forming a photosensitive resin coating film of a photosensitive resin composition on a substrate.

First, the photosensitive resin composition used in this step (1) will be described.

<Photosensitive Resin Composition>

The embodiment of the photosensitive resin composition in the present invention contains, at least, (A) a resin whose solubility in alkali is increased by the action of an acid, (B) a photoacid generator, and (C) a compound which is decomposed by the action of an acid to form a primary or secondary amine.

In the photosensitive resin coating film formed of the photosensitive resin composition, when an acid is generated upon light exposure, a chemical reaction (for example, change in polarity, decomposition of a chemical bond, etc.) takes place by the catalytic action of the acid, so that the solubility in the developer changes in the exposed part. The embodiment of the photosensitive resin composition in the present invention is a resin composition for production of plated shaped structures, which utilizes this phenomenon to form a resist pattern serving as a mold for the plating process.

The mechanism for forming this pattern will be further described below. First, an acid is generated by light exposure of the photoacid generator (B) and the like. The acid-dissociable functional group contained in the positive-type photosensitive resin composition is reacted by the catalytic action of the acid to be an acidic functional group and to generate an acid-dissociated substance. As a result, the solubility of the exposed portion of the polymer in the alkaline developer increases. In addition, the reaction of the acid-dissociable functional group is promoted by heating after light exposure (Post Exposure Bake: hereinafter referred to also as "PEB").

The acid newly generated by the reaction of the acid-dissociable functional group acts as a catalyst for the reaction of other acid-dissociable functional group, and the reaction of the acid-dissociable functional group and the generation of the acid are successively "amplified". By utilizing such a chemical amplification action, a predetermined pattern is formed with high sensitivity (that is, low exposure amount) and high resolution.

[Resin (A)]

The resin (A) is a resin whose solubility in alkali is increased by the action of an acid, and which has a group decomposed by the action of the acid to generate an alkali-soluble group (hereinafter referred to also as "acid-dissociable group") in at least one of the main chain and side chain. Namely, it is a resin in which an acidic functional group is protected with an acid-dissociable group, and the acid-dissociable group is dissociated by the action of an acid to generate an alkali-soluble group, resulting in increase in solubility in alkali.

The acidic functional group is not particularly limited as long as it exhibits acidity, and examples thereof include a phenolic hydroxyl group, a carboxyl group, and a sulfonic acid group. They may be contained alone, or two or more thereof may be contained in combination.

Any group may be used as the acid-dissociable group so long as the group is generally used in a positive-type chemical amplification photosensitive resin composition, and examples thereof include the acid-dissociable groups described in Patent Literatures 1 and 2 presented above, and JP-A 2014-013381, JP-A 2015-526752, JP-A 2016-099483 A, and JP-A 2017-037320, which are regarded as being described herein.

Specific examples of the acid-dissociable group include groups represented by the following formula (1) and the following formula (2).

In the formula (1), $R^{1a}$ to $R^{1c}$ each independently represent a saturated hydrocarbon group or an unsaturated hydrocarbon group, or a ring structure in which at least two of $R^{1a}$ to $R^{1c}$ are mutually bonded, and the hydrogen atoms of $R^{1a}$ to $R^{1c}$ and the ring structure, respectively, may be substituted with other group.

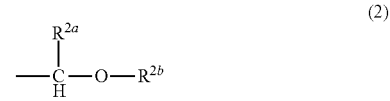

In the formula (2), $R^{2a}$ and $R^{2b}$ each independently represent a saturated hydrocarbon group or an unsaturated hydrocarbon group, or a ring structure in which $R^{2a}$ and $R^{2b}$ are mutually bonded; the hydrogen atoms of $R^{2a}$ and $R^{2b}$ and the ring structure, respectively, may be substituted with other group.

Examples of the saturated hydrocarbon group represented by $R^{1a}$ to $R^{1c}$, $R^{2a}$, and $R^{2b}$ include an alkyl group such as a methyl group, an ethyl group, an n-propyl group, an i-propyl group, an n-butyl group, a 2-methylpropyl group, a 1-methylpropyl group, and a t-butyl group; and a cycloalkyl group such as a cyclopropyl group, a cyclobutyl group, a cyclopentyl group, a cyclohexyl group, a cycloheptyl group, a cyclooctyl group, a cyclodecyl group, a cyclododecyl group, a norbornyl group, an adamantyl group, a tricyclodecyl group, and a tetracyclododecyl group.

Examples of the unsaturated hydrocarbon group represented by $R^{1a}$ to $R^{1c}$, $R^{2a}$, and $R^{2b}$ include a cycloalkenyl group such as a cyclopropenyl group, a cyclobutenyl group, a cyclopentenyl group, a cyclohexenyl group, a cyclooctenyl group, a cyclodecenyl group, a norbornenyl group, a tricyclodecenyl group, and a tetracyclododecenyl group; an aryl group such as a phenyl group, a tolyl group, a xylyl group, a naphthyl group and an anthryl group; and an aralkyl group such as a benzyl group, a phenethyl group, and a naphthylmethyl group.

Examples of the ring structure in which at least two of $R^{1a}$ to $R^{1c}$ are mutually bonded include the groups listed as the cycloalkyl group and the cycloalkenyl group above.

Examples of other group which substitutes for the hydrogen atom of each of $R^{1a}$ to $R^{1c}$ and the ring structure in which at least two of $R^{1a}$ to $R^{1c}$ are mutually bonded as well as $R^{2a}$ and $R^{2b}$ and the ring structure in which $R^{2a}$ and $R^{2b}$ are mutually bonded include an alkyl group, a cycloalkyl group, an alkenyl group, an alkynyl group, an alkoxy group, an aryl group, a hydroxyl group, a carboxyl group, a carbonyl group, and an amino group.

Examples of a structural unit (A 1) having an acid-dissociable group in the resin (A) include: a structural unit (3) having an acid-dissociable group represented by the following general formula (3); a structural unit having a phenolic hydroxyl group of novolac in which a hydrogen atom is replaced with an acid-dissociable group; a structural unit derived from hydroxystyrene in which a hydrogen atom of a phenolic hydroxyl group is replaced with an acid-dissociable group; and a structural unit derived from hydroxyphenyl (meth)acrylate in which a hydrogen atom of a phenolic hydroxyl group is replaced with an acid-dissociable group.

Among these, the resin (A) includes the structural unit (3) with an acid-dissociable group represented by the following general formula (3), thereby making it possible to increase the dissolution contrast in the developer between the exposed part and the unexposed part.

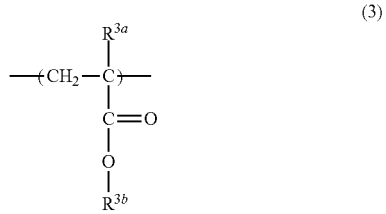

(3)

In the formula (3), $R^{3a}$ is a hydrogen atom or an alkyl group, and $R^{3b}$ is an acid-dissociable group.

The resin (A) may contain only one type, or two or more types, of the structural unit (A1) having an acid-dissociable group.

In addition to the structural unit (A1) having an acid-dissociable group, the resin (A) may also have a structural unit (A2) having a solubility promoting group such as a carboxyl group, a phenolic hydroxyl group, a sulfonic acid group, and/or a lactone structure for the purpose of adjusting the solubility in a developer.

Any structural unit may be used as the structural unit (A2) so long as the structural unit is generally used in a positive-type chemical amplification photosensitive resin composition, and examples thereof include a structural unit having a solubility promoting group described in Patent Literatures 1 and 2 presented above, and JP-A 2014-013381, JP-A 2015-526752, JP-A 2016-099483, and JP-A 2017-037320, which are regarded as being described herein.

Among these, a structural unit having a phenolic hydroxyl group is preferably included because a resist capable of suppressing the infusion of a plating material can be easily formed. The phenolic hydroxyl group means a hydroxyl group directly bonded onto an aromatic ring.

As the structural unit having a phenolic hydroxyl group, a structural unit (4) with a phenolic hydroxyl group represented by the following general formula (4) or a structural unit (5) with a phenolic hydroxyl group represented by the following general formula (5) is preferable because a resist capable of suppressing the infusion of a plating material can be easily formed.

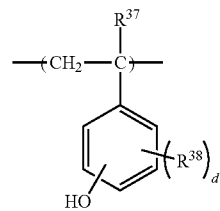

(4)

In the formula (4), $R^{37}$ is a hydrogen atom or a methyl group, and $R^{38}$ is a hydrogen atom or so a monovalent organic group. Further, d represents an integer of 1 to 4. Where a plurality of $R^{38}$ are present, the plurality of $R^{38}$ may be identical with or different from each other.

Examples of the monovalent organic group include an alkyl group, an alkoxy group, an aryl group, an alkenyl group, a group having a cyclic ether structure such as a glycidyl group, and the like.

Examples of the alkyl group include a linear or branched alkyl group having 1 to 5 carbon atoms. Specifically, a methyl group, an ethyl group, a propyl group, a butyl group, and the like are exemplified.

Examples of the alkoxy group include a linear or branched alkoxy group having 1 to 10 carbon atoms. Specifically, a methoxy group, an ethoxy group, an n-propoxy group, an i-propoxy group, an n-butoxy group, a 2-methyl-propoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like are exemplified.

Examples of the aryl group include a phenyl group, a naphthyl group, a methylphenyl group, a benzyl group, a phenethyl group, an ethylphenyl group, a chlorophenyl group, a bromophenyl group, a fluorophenyl group, and the like. Among these, a phenyl group is preferable.

Examples of the alkenyl group include a vinyl group, a 1-propenyl group, a 2-propenyl group (allyl group), a 3-butenyl group, a 3-pentenyl group, a 3-hexenyl group, and the like.

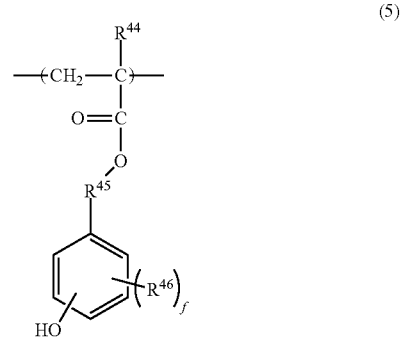

(5)

In the formula (5), $R^{44}$ is a hydrogen atom or a methyl group; $R^{45}$ is a single bond, a methylene group or an alkylene group having 2 to 4 carbon atoms; and $R^{46}$ is a hydrogen atom or a monovalent organic group. f represents an integer of 1 to 4. Where a plurality of $R^{46}$ are present, the plurality of $R^{46}$ may be identical with or different from each other.

The description about the structural unit (4) can be applied as it is to the monovalent organic group.

In addition, the resin (A) may contain only one type, or two or more types, of the structural units (A2) having an acidic group.

The resin (A) may include other structural unit (A3), in addition to the structural unit (A1) having an acid-dissociable group and the structural unit (A2) having a solubility promoting group.

Examples of the other structural unit (A3) include a unit obtained by cleavage of an unsaturated bond of, for example:

a vinyl aromatic compound such as styrene, α-methylstyrene, 2-methylstyrene, 3-methylstyrene, 4-methylstyrene, 2-methoxystyrene, 3-methoxystyrene, 4-methoxystyrene, 4-t-butoxycarbonylmethyloxystyrene, 4-(2'-t-butoxycarbonylethyloxy) styrene, 4-tetrahydrofuranyloxystyrene, 4-tetrahydropyranyloxystyrene, and a monomer represented by the following general formula (a);

a (meth)acrylic acid ester such as methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth)acrylate, n-pentyl (meth)acrylate, neopentyl (meth)acrylate, n-hexyl ss (meth)acrylate, 2-ethylhexyl (meth)acrylate, 2-hydroxyethyl (meth)acrylate, 2-hydroxypropyl (meth)acrylate, 3-hydroxypropyl (meth)acrylate, cyclopentyl (meth)acrylate, cyclohexyl (meth)acrylate, norbornyl (meth)acrylate, isobornyl (meth)acrylate, tricyclodecanyl (meth)acrylate, dicyclopentenyl (meth)acrylate, adamantyl (meth)acrylate, 2-methyladamantyl (meth)acrylate, tetrahydrofuranyl (meth)acrylate, tetrahydropyranyl (meth)acrylate, phenyl (meth)acrylate, benzyl (meth)acrylate, phenethyl (meth) acrylate, and monomers represented by the following general formulas (b) and (c);

an unsaturated carboxylic acid such as (meth)acrylic acid, crotonic acid, maleic acid, fumaric acid, and cinnamic acid;

a carboxyalkyl ester of an unsaturated carboxylic acid such as 2-carboxyethyl (meth)acrylate, 2-carboxypropyl (meth)acrylate, and 3-carboxypropyl (meth)acrylate; unsaturated nitrile compounds such as (meth)acrylonitrile, α-chloroacrylonitrile, croton nitrile, maleic nitrile, and fumaronitrile;

an unsaturated amide compound such as (meth)acrylamide, N,N-dimethyl (meth)acrylamide, crotonamide, maleamide, and fumaramide;

an unsaturated imide compound such as maleimide, N-phenyl maleimide, and N-cyclohexyl maleimide; and other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole.

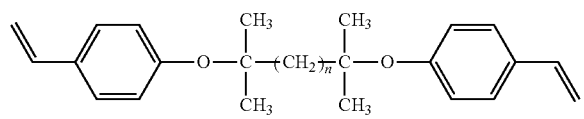
(a)

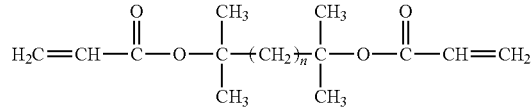
(b)

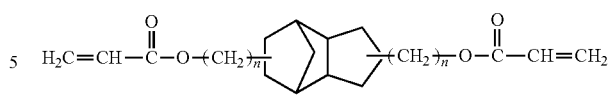
(c)

In the formulae (a) to (c), n each represents a natural number of 1 to 6.

The resin (A) may contain only one type, or two or more types, of the other structural unit (A3).

A content ratio of the structural unit (A1) having an acid-dissociable group included in the resin (A) is usually in a range from 20% to 65% by mol, preferably from 30% to 55% by mol, and more preferably from 35% to 50% by mol when a total of all the structural units constituting the resin (A) is 100% by mol.

A total content ratio of the structural unit (A2) having a solubility promoting group included in the resin (A) is usually in a range from 35% to 80% by mol, preferably from 45% to 70% by mol, and more preferably from 50% to 60% by mol when a total of all the structural units constituting the resin (A) is 100 mol %.

The weight average molecular weight (hereinafter referred to as "Mw") of the resin (A) in terms of polystyrene as measured by gel permeation chromatography is preferably in a range from 1,000 to 500,000, and more preferably from 3,000 to 300,000.

Furthermore, the ratio (Mw/Mn) of the Mw of the resin (A) to the number average molecular weight (hereinafter referred to as "Mn") of the resin (A) in terms of polystyrene as measured by gel permeation chromatography is usually in a range from 1 to 5, and preferably from 1 to 3.

The resin (A) can be produced, for example, by: a method of introducing one or more types of acid-dissociable groups into an acidic functional group in an alkali-soluble resin produced in advance; a method of polymerizing one or more types of polymerizable unsaturated monomers having an acidic functional group protected with an acid-dissociable group; a method of polymerizing the one or more types of polymerizable unsaturated monomers and one or more types of other polymerizable unsaturated monomers; a method of polycondensing one or more types of polycondensation components having an acidic functional group protected with an acid-dissociable group; or a method of polycondensing the one or more types of polycondensation components and one or more types of other polycondensation components.

Here, in the method of polymerizing one or more types of polymerizable unsaturated monomers having an acid functional group protected with an acid-dissociable group, or the method of polymerizing the one or more types of polymerizable unsaturated monomers and one or more types of other polymerizable unsaturated monomers, it is possible to appropriately select a polymerization initiator or polymerization catalyst such as a radical polymerization initiator, an anionic polymerization catalyst, a coordination anionic polymerization catalyst, or a cationic polymerization catalyst and to appropriately adopt a polymerization method such as bulk polymerization, solution polymerization, precipitation polymerization, emulsion polymerization, suspension polymerization or bulk-suspension polymerization, depending on the types of monomers and reaction medium, and the like. Also, in the method of polycondensing one or more types of polycondensation components having an acidic functional group protected with an acid-dissociable group, or the method of polycondensing the one or more types of polycondensation components and one or more types of other polycondensation components, (co)polycondensation can be carried out in the presence of an acidic catalyst, in a water medium or in a mixed medium of water and a hydrophilic solvent.

Examples of the radical polymerization initiator include an azo compound such as 2,2'-azobisisobutyronitrile (AIBN) and 2,2'-azobis-(2,4-dimethylvaleronitrile), an organic peroxide such as benzoyl peroxide, lauryl peroxide and t-butyl peroxide, and the like.

The solvent used for the solution polymerization method is not particularly limited as long as it does not react with the monomer component to be used and it dissolves the produced polymer. Examples of the solvent include methanol, ethanol, n-hexane, toluene, tetrahydrofuran, 1,4-dioxane, ethyl acetate, n-butyl acetate, acetone, methyl ethyl ketone, methyl isobutyl ketone, 2-heptanone, cyclohexanone, ethylene glycol monomethyl ether, propylene glycol monomethyl ether, propylene glycol monomethyl ether acetate, methyl 3-methoxypropionate, ethyl 3-ethoxypropionate, ethyl lactate, γ-butyrolactone, and the like. These solvents may be used alone, or two or more types thereof may be mixed and used.

When the resin (A) is produced by solution polymerization method, the polymer solution obtained can be used as it is for preparation of a positive-type photosensitive resin composition, or the resin (A) can be separated from the polymer solution and used for preparation of a positive-type photosensitive resin composition.

Moreover, at the time of polymerization, a molecular weight regulator such as a mercaptan compound and a halogen hydrocarbon may be used as needed.

In the photosensitive resin composition, the resin (A) may be used alone, or two or more types thereof may be mixed and used.

[Photo Acid Generator (B)]

The photoacid generator (B) is a compound that generates an acid upon light exposure (irradiation with radial rays). The action of the acid causes dissociation of the acid-dissociable group present in the above-described resin (A) to produce an acidic functional group such as a carboxyl group or a phenolic hydroxyl group. As a result, the exposed region of the photosensitive resin coating film formed from the photosensitive resin composition becomes easily soluble in the alkaline developer, so that a positive-type resist pattern can be formed.

Examples of the photoacid generator (B) include an onium salt compound (including a thiophenium salt compound), a halogen-containing compound, a diazoketone compound, a sulfone compound, a sulfonic acid compound, a sulfoneimide compound, a diazomethane compound, and the like. Hereinafter, examples of these compounds are indicated.

Examples of the onium salt compound include a iodonium salt, a sulfonium salt, a phosphonium salt, a diazonium salt, a pyridinium salt, and the like.

Examples of the onium salt compound include diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium hexafluoroantimonate, triphenylsulfonium hexafluorophosphate, 4-t-butylphenyl diphenylsulfonium trifluoromethanesulfonate, 4-t-butylphenyl diphenylsulfonium perfluoro-n-octanesulfonate, 4-t-butylphenyl diphenylsulfonium pyrenesulfonate, 4-t-butylphenyl diphenylsulfonium n-dodecylbenzenesulfonate, 4-t-butylphenyl diphenylsulfonium p-toluenesulfonate, 4-t-butylphenyl diphenylsulfonium benzenesulfonate, and 4,7-di-n-butoxynaphthyl tetrahydrothiophenium trifluoromethanesulfonate.

Examples of the halogen-containing compound include a haloalkyl group-containing hydrocarbon compound, a haloalkyl group-containing heterocyclic compound, and the like.

Examples of the halogen-containing compound include 1,10-dibromo-n-decane, 1,1-bis(4-chlorophenyl)-2,2,2-trichloroethane, and a (trichloromethyl)-s-triazine derivative such as phenyl-bis(trichloromethyl)-s-triazine, 4-methoxyphenyl-bis(trichloromethyl)-s-triazine, styryl-bis(trichloromethyl)-s-triazine, and naphthyl-bis(trichloromethyl)-s-triazine.

Examples of the diazo ketone compound include a 1,3-diketo-2-diazo compound, a diazobenzoquinone compound, a diazonaphthoquinone compound, and the like.

Preferred examples of the diazo ketone compound include 1,2-naphthoquinonediazide-4-sulfonic acid esterified products of phenols and 1,2-naphthoquinonediazide-5-sulfonic acid esterified products of phenols.

Examples of the sulfonated compound include β-ketosulfone, β-sulfonylsulfone, α-diazo compounds of these compounds, and the like.

Examples of the sulfone compound include 4-trisphenacyl sulfone, mesityl phenacyl sulfone, and bis(phenylsulfonyl)methane.

Examples of the sulfonic acid compound include an alkylsulfonic acid ester, a haloalkylsulfonic acid ester, an arylsulfonic acid ester, an iminosulfonate, and the like.

Examples of the sulfonic acid compound include benzoin tosylate, pyrogallol tristrifluoromethanesulfonate, o-nitrobenzyl trifluoromethanesulfonate, and o-nitrobenzyl-p-toluenesulfonate.

Examples of the sulfone imide compound include N-(trifluoromethylsulfonyloxy)succinimide, N-(trifluoromethylsulfonyloxy)phthalimide, N-(trifluoromethylsulfonyloxy)diphenyl maleimide, N-(trifluoromethylsulfonyloxy)bicyclo[2.2.1]hept-5-ene-2,3-dicarboximide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptane-5,6-oxy-2,3-dicarboximide, N-(trifluoromethylsulfonyloxy)naphthylimide, N-(trifluoromethylsulfonyloxy)-4-butyl-naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboximide, N-(4-methylphenylsulfonyloxy)-7-oxabicyclo[2.2.1]hept-5-ene-2,3-dicarboximide, N-(4-methylphenylsulfonyloxy)bicyclo[2.2.1]heptane-5,6-oxy-2,3-dicarboximide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboximide, N-(2-trifluoromethylphenylsulfonyloxy)-7-oxabicyclo[2.2.1]hept-5-ene-2,3-dicarboximide, N-(2-trifluoromethylphenylsulfonyloxy)bicyclo[2.2.1]heptane-5,6-oxy-2,3-dicarboximide, N-(2-trifluoromethylphenylsulfonyloxy)naphthylimide, N-(4-fluorophenylsulfonyloxy)succinimide, N-(4-fluorophenylsulfonyloxy)-7-oxabicyclo[2.1.1]hept-5-ene-2,3-dicarboximide, N-(4-fluorophenylsulfonyloxy)bicyclo[2.1.1]heptane-5,6-oxy-2, 3-dicarboximide, N-(4-fluorophenylsulfonyloxy) naphthylimide, N-(10-camphor-sulfonyloxy)naphthylimide, and the like.

Examples of the diazomethane compound include bis (trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl-p-toluenesulfonyldiazomethane, cyclohexylsulfonyl-1,1-dimethylethylsulfonyldiazomethane, bis(1,1-dimethylethylsulfonyl)diazomethane, and the like.

As the photoacid generator (B), an onium salt compound, a sulfone imide compound, and a diazomethane compound are preferable. In particular, a sulfoneimide compound that generates trifluoromethanesulfonic acid upon irradiation with radial rays is preferable. More specifically, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo [2.2.1]hept-5-ene-2,3-dicarboximide, N-(trifluoromethylsulfonyloxy)-7-oxabicyclo[2.2.1]hept-5-ene-2,3-dicarboxy imide, N-(trifluoromethylsulfonyloxy)bicyclo[2.2.1]heptane-5,6-oxy-2,3-dicarboximide, N-(trifluoromethylsulfonyloxy)naphthylimide, and N-(trifluoromethylsulfonyloxy)-4-butyl-naphthylimide are preferable.

The photoacid generator (B) may be used alone, or two or more types thereof may be mixed and used.

A content of the photoacid generator (B) is preferably in a range from 0.1 to 20 parts by mass, more preferably from 0.3 to 15 parts by mass, and further preferably from 0.5 to 10 parts by mass with respect to 100 parts by mass of the resin (A). When the amount of the photoacid generator (B) to be incorporated is in the above range, a resist having excellent sensitivity, resolution, and transparency to radial rays can be obtained, and a pattern having an excellent shape can be obtained.

[Compound (C)]

The compound (C) is a compound which is decomposed by the action of an acid to form a primary or secondary amine.

The compound (C) has the action of suppressing the infusion of a plating material during a plating process in a positive-type resist in which a non-exposed region of a resist film remains on a substrate as a resist pattern. The action mechanism for suppressing the infusion will be described in detail later.

The compound (C) has the action of controlling the diffusion phenomenon of the acid generated from the photoacid generator (B) in the resist film upon light exposure of the resist film and suppressing an undesirable chemical reaction in the non-exposed region (that is, by producing a primary or secondary amine, it acts as an acid diffusion control agent). The incorporation of the compound (C) improves the resolution as a resist and can suppress a change in line width of the resist pattern due to the fluctuation in post-exposure delay time (PED) from light exposure to development, so that a photosensitive resin composition having excellent process stability can be obtained. Furthermore, the storage stability of the photosensitive resin composition can be improved.

Examples of the compound (C) include the compounds described in JP-A 2001-166476, JP-A 2004-347738, and JP-A 2009-199021, which are regarded as being described herein.

Examples of the compound (C) include an amine derivative in which an acid-dissociable group is bonded to a nitrogen atom, and amine derivatives in which a compound of the following formula (6) or (7) is bonded to a nitrogen atom.

In the formula (6), $R^{6a}$ represents an acid-dissociable group.

Examples of the acid-dissociable group include those listed as the acid-dissociable group in the resin (A).

Specific examples of the compound (C) include an alkoxycarbonylated amine such as an N-(alkoxycarbonyl) piperidine, an N-(alkoxycarbonyl)-4-hydroxypiperidine, an N-(alkoxycarbonyl)imidazole, an N-(alkoxycarbonyl)benzimidazole, an N-(alkoxycarbonyl)-2-phenylbenzimidazole, an N-(alkoxycarbonyl)dioctylamine, an N-(alkoxycarbonyl) diethanolamine, an N-(alkoxycarbonyl)dicyclohexylamine, and an N-(alkoxycarbonyl) diphenylamine. The compound (C) is preferably an alkoxycarbonylated amine.

Further, the configuration of the alkoxy at the alkoxycarbonyl moiety in the alkoxycarbonylated amine is not particularly limited, and may be a linear or branched alkoxy group having 1 to 8 carbon atoms.

Examples of the alkoxy group having 1 to 8 carbon atoms include a methoxy group, an ethoxy group, a propoxy group, an isopropoxy group, a butoxy group, an isobutoxy group, a sec-butoxy group, a tert-butoxy group, a pentaoxy group, an isopentaoxy group, a hexaoxy group, a heptaoxy group, an octaoxy group, and the like. Among these, an isopentaoxy group is preferable. That is, among the alkoxycarbonylated amine, an isopentaoxycarbonylated amine is preferable.

In the photosensitive resin composition, the compound (C) may be used alone, or two or more types thereof may be mixed and used.

A content of the compound (C) to be used is preferably 100 mol or less, more preferably in a range from 10 to 80 mol and more, and further preferably form 20 to 60 mol with respect to 100 mol of the photoacid generator (B). When the content of the compound (C) is in the above range, it is possible to sufficiently suppress the infusion of a plating material during the plating process. Furthermore, the sensitivity as a resist and the developability of the exposed part can be improved, and the reduction in pattern shape and dimensional fidelity as a resist can be suppressed.

The photosensitive resin composition may contain a solvent, a surfactant, a quencher (except for the compound (C)), and other additives in addition to the resin (A), the photoacid generator (B), and the compound (C).

[Solvent]

The photosensitive resin composition may contain a solvent for a purpose of uniformly mixing the respective components.

Examples of the solvent include an ether, an ester, an ether ester, a ketone, a ketone ester, an amide, an amide ester, a lactam, a lactone, a (halogenated) hydrocarbon, and the like.

Specific examples include an ethylene glycol monoalkyl ether, a diethylene glycol dialkyl ether, a propylene glycol monoalkyl ether, a propylene glycol dialkyl ether, an ethylene glycol monoalkyl ether acetate, a propylene glycol monoalkyl ether acetate, an acetic acid ester, a hydroxyacctic acid ester, a lactic acid ester, an alkoxyacetic acid ester, a (non) cyclic ketone, an acetoacetic acid ester, a pyruvic acid ester, a propionic acid ester, an N,N-dialkylformamide, an N,N-dialkylacetamide, an N-alkylpyrrolidone, a γ-lactone, a (halogenated) aliphatic hydrocarbon, a (halogenated) aromatic hydrocarbon, and the like.

More specific examples include ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, propylene glycol monomethyl ether acetate, propylene glycol monoethyl ether acetate, propylene glycol mono-n-propyl ether acetate, isopropenyl acetate, isopropenyl propionate, toluene, xylene, methyl ethyl ketone, cyclohexanone, 2-heptanone, 3-heptanone, 4-heptanone, ethyl 2-hydroxypropionate, ethyl 2-hydroxy-2-methylpropionate, ethyl ethoxyacetate, ethyl hydroxyacetate, methyl 2-hydroxy-3-methylbutyrate, methyl lactate, ethyl lactate, n-propyl lactate, i-propyl lactate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl 3-methoxypropionate, ethyl 3-methoxypropionate, methyl 3-ethoxypropionate, ethyl 3-ethoxypropionate, N-methylpyrrolidone, N,N-dimethylformamide, N,N-dimethylacetamide, and the like.

Among these, a propylene glycol monoalkyl ether acetate, 2-heptanone, a lactic acid ester, a propionic acid ester (specifically, a 2-hydroxypropionic acid ester such as ethyl 2-hydroxypropionate and a 3-alkoxypropionic acid ester such as methyl 3-methoxypropionate), and the like are preferably used because the in-plane uniformity at the time of coating is good.

These organic solvents may be used alone, or two or more types thereof may be used in combination.

[Surfactant]

The surfactant which is capable of adding to the photosensitive resin composition has a function of improving coatability of the photosensitive resin composition, defoaming properties, developability, and the like.

As the surfactant, commercially available surfactants may be used. Examples of the commercially available surfactant include NBX-15, FTX-204D, FTX-208D, FTX-212D, FTX-216D, FTX-218, FTX-220D, and FTX-222D (all manufactured by Neos Co., Ltd.); BM-1000 and BM-1100 (both manufactured by BM Chemie); Megafac F142D, F172, F173, and F183 (all manufactured by Dainippon Ink and Chemicals, Inc.); Fluorad FC-135, FC-170C, FC-430, and FC-431 (all manufactured by Sumitomo 3M Ltd.); Surflon S-112, S-113, S-131, S-141, and S-145 (all manufactured by Asahi Glass Co., Ltd.); and SH-28PA, SH-190, SH-193, SZ-6032, and SF-8428 (all manufactured by Dow Corning Toray Silicone Co., Ltd.). Among these, FTX-216D, FTX-218 and FTX-220D are preferable.

The surfactants may be used alone, or two or more types thereof may be mixed and used.

A content of the surfactant contained in the photosensitive resin composition is usually 2 parts by mass or less with respect to 100 parts by mass of the resin (A).

[Quencher]

The photosensitive resin composition may contain a quencher (except for the compound (C)) for the purpose of controlling the diffusion of an acid generated from the photoacid generator (B) in the resist film upon light exposure.

Any quencher may be used as long as it is a compound generally used in a positive-type chemical amplification photosensitive resin composition, and examples thereof include the compounds described in Patent Literatures 1 and 2 presented above, and JP-A 2014-013381, JP-A 2015-526752, JP-A 2016-099483, and JP-A 2017-037320, which are regarded as being described herein.

The quenchers may be used alone, or two or more thereof may be used in combination.

A content of the quencher contained in the photosensitive resin composition is usually 0.001 to 10 parts by mass with respect to 100 parts by mass of the resin (A).

[Other Additives]

Examples of the other additives include an alkali-soluble resin for the purpose of controlling a dissolution speed of the resin coating film formed from the photosensitive resin composition in the alkaline developer; a sensitizer for the purpose of improving an apparent sensitivity of the photosensitive resin composition; a UV absorber for the purpose of blocking a photoreaction due to leakage of scattered light to the unexposed part during light exposure; a thermal polymerization inhibitor for enhancing the storage stability; an antioxidant, an adhesion aid, an inorganic filler, and the like.

[Production of Photosensitive Resin Composition]

The embodiment of the photosensitive resin composition of the present invention can be produced by uniformly mixing the respective components so that a solid content concentration becomes usually 20% to 90% by mass, preferably a range from 35% to 80% by mass, and more preferably a range from 50% to 70% by mass. The solid content concentration represents a content ratio of the components except for the solvent contained in the photosensitive resin composition.

In addition, in order to remove dust, the resultant mixture may be filtered through a filter or the like after uniform mixing of the components.

Then, the details of this step (1) will be described.

As the substrate in the step (1), any substrate that is capable of forming a photosensitive resin coating film may be used without particular limitation, and examples thereof include a semiconductor substrate, a glass substrate, a silicon substrate, and substrates in which a conductive layer such as a film of various metal is provided on surfaces of these substrates. A shape of the substrate may be used without particular limitation, and examples thereof include a plate shape and a concavo-convex shape such as a TSV structure. Any size can also be used without limitation.

Examples of a conductive material used to form a conductive layer on a surface of the substrate include aluminum, copper, silver, gold, palladium, and alloys of two or more types thereof (for example, palladium-gold). The conductive layer on the substrate surface can be formed by processing the conductive material, for example, through sputtering. A thickness of the conductive layer is not particularly limited, but is usually in a range from 200 to 10,000 Å, and preferably from 500 to 2,000 Å.

The photosensitive resin coating film in the step (1) can be formed by applying the photosensitive resin composition onto the substrate and then removing a volatile component partially or entirely as required.

Examples of a method for applying the photosensitive resin composition include a spin coating method, a roll coating method, a screen printing method, an applicator method, and the like. Among these methods, a spin coating is preferable.

In the case of a spin coating, a rotational speed is usually in a range from 500 to 4,000 rpm, and preferably from 800 to 3,500 rpm.

A thickness of the photosensitive resin coating film is preferably in a range from 1 to 100 μm, more preferably from 5 to 80 μm, and further preferably from 15 to 60 μm.

The volatile component is usually removed by heating the photosensitive resin coating film, and the heating condition varies depending on types or incorporation ratio of components in the resin composition, the thickness of the applied film, and the like, but is usually a period of time for 5 to 20 minutes at a temperature between 70° C. and 140° C., and preferably a period of time for 2 to 10 minutes at a temperature between 80° C. and 130° C.

Moreover, the photosensitive resin coating film to be formed on the substrate can be formed by a method of applying a photosensitive resin composition onto a support film to form a transfer film having a photosensitive resin coating film and using the transfer film to transfer and laminate the photosensitive resin coating film on a substrate. Any material for the support film can be used without particular limitation as long as it has strength enough to withstand the preparation and use of the transfer film.

[Step (2)]

The step (2) is a step of exposing the photosensitive resin coating film formed in the step (1) to light.

Specifically, this step is a step of irradiating the photosensitive resin coating film with radial rays through a mask having a pattern corresponding to the structure of the target plated shaped structure.

The light exposure may be unmagnified exposure, or may be reduction projection exposure using a stepper or a scanner.

The radial ray used for light exposure is usually a light having a wavelength between 150 nm and 600 nm, and preferably a light having a wavelength of 200 to 500 nm.

An exposure amount varies depending on types of the radial rays, the formulation of the composition, a thickness of the resin coating film, and the like, but is usually 100 to 20,000 mJ/cm².

[Step (3)]

The step (3) is a step of developing the exposed photosensitive resin coating film after light exposure in the step (2) to form a resist pattern.

The development can be performed by a shower developing method, a spray developing method, an immersion developing method, a paddle developing method or the like using an alkaline developer. The developing time is usually about 1 to 30 minutes at normal temperature. After development with the alkaline developer, the photosensitive resin coating film is usually washed with water and dried.

Examples of the alkaline developer include an aqueous alkaline solution in which at least one of alkaline compounds such as sodium hydroxide, potassium hydroxide, sodium carbonate, sodium silicate, ammonia water, ethylamine, n-propylamine, diethylamine, triethylamine, monoethanolamine, diethanolamine, triethanolamine, tetramethylammonium hydroxide, tetraethylammonium hydroxide, choline, pyrrole, and piperidine is dissolved in water to a concentration of, for example, 1% to 10% by mass. An appropriate amount of an organic solvent such as methanol and ethanol or a surfactant may be added to the aqueous alkaline solution.

[Step (4)]

The step (4) is a step of performing a plating process using the resist pattern formed in the step (3) as a mask.

Specifically, the resist pattern is used as a mold, and a plated shaped structure (for example, an electrode) is formed by an electrolytic plating process. At this time, in order to enhance the affinity between the pattern surface and the plating solution, it is preferable to subject the pattern formed from the resin film to hydrophilization treatment such as ashing treatment with oxygen plasma.

Examples of a plating solution used for electrolytic plating include plating solutions containing components similar to the metals and alloys illustrated for the conductive layer, and plating solutions containing a nickel component. In particular, in the embodiment of the present invention, this plating process may be a copper plating process using copper sulfate or a nickel plating process using nickel sulfate, and furthermore may be a copper plating process using copper sulfate.

The conditions for electrolytic plating vary depending on the formulation of the plating solution and the like. In the case of gold plating, the temperature is usually in a range from 40° C. to 70° C., and preferably from 55° C. to 70° C., and the current density is usually in a range from 0.1 to 1 A/dm², and preferably from 0.2 to 0.8 A/dm².

In the case of copper plating, the temperature is usually in a range from 10° C. to 90° C., and preferably from 20° C. to 70° C., and the current density is usually in a range from 0.3 to 30 A/dm², and preferably from 0.5 to 20 A/dm².

Furthermore, in the case of nickel plating, the temperature is usually in a range from 20° C. to 90° C., and preferably from 40° C. to 70° C., and the current density is usually 0.3 to 30 A/dm², and so preferably from 0.5 to 20 A/dm².

Plating is followed by washing with water and drying. Then, the state of the pattern, the thickness and state of the plated shaped structure, and the like are observed, and electrolytic plating can be performed again according to need.

A thickness of the plated shaped structure varies depending on the intended use, but is usually in a range from 5 to 100 μm, preferably from 10 to 80 μm, and more preferably from 20 to 60 μm when the plated shaped structure is a bump. When the plated shaped structure is a wiring, the thickness is usually in a range from 1 to 30 μm, preferably from 3 to 20 μm, and more preferably from 5 to 15 μm.

[Other Steps]

The embodiment of the production method of a plated shaped structure in the present invention may further include a step (5) of removing the resist pattern after the step (4).

Specifically, this step (5) is a step of stripping and removing the resist pattern (resin film portion) remaining in step (4), and, for example, a method of immersing the substrate in a stripping solution being stirred at a temperature between 20° C. and 80° C., for example, for about 1 to 10 minutes is indicated.

As the stripping solution, a solution containing tetramethyl ammonium hydroxide, dimethyl sulfoxide and/or N,N-dimethylformamide may be used.

The embodiment of the production method of a plated shaped structure in the present invention may include a step (6) of removing the conductive layer in a region other than the region where the plated shaped structure is formed through wet etching or the like.

<Function Mechanism for Suppressing Infusion of Plating Material>

The function mechanism (inference) by which the infusion of the plating material during the plating process is suppressed in the embodiment of the method for producing a plated shaped structure of the present invention will be described.

In the conventional method, it is inferred that infusion of the plating material would occur for the following reasons.

In a positive-type resist using a conventional resin composition in which a resist film is formed on a substrate and patterned by exposure and development, a strongly basic amine incorporated as a quencher (acid diffusion control agent) is left. It is considered that, when this positive-type resist is plated with a sulfate (e.g., copper plating process with copper sulfate), the strongly basic amine forms a salt with sulfuric acid so that sulfuric acid is introduced into the resist, and as a result, copper ions penetrate the bottom of the resist, thereby causing infusion of the plating material. That is, it is presumed that the presence of the strongly basic amine acting on sulfuric acid would contribute to the infusion of the plating material.

On the other hand, in the embodiment of the photosensitive resin composition of the present invention, the compound (C) which is decomposed by the action of an acid to produce a primary or secondary amine, i.e., in which the basicity of the amine is reduced by the presence of an acid-dissociable group, is used as a quencher. In the positive-type resist film, this compound (C) causes dissociation of the acid-dissociable group by the action of the acid and produces a primary or secondary amine to exert the acid diffusion controlling action in the exposed region, and does not undergo the action of the acid so much and remains in the positive-type resist pattern in a state where it still has an acid-dissociable group in the non-exposed region. Therefore, when a copper plating process with copper sulfate is applied to a positive-type resist patterned using a photosensitive resin composition containing such a compound (C), the quencher remains in the patterned resist with its basicity reduced, due to the presence of the acid-dissociable group, thereby making it possible to relatively reduce formation of a salt with sulfuric acid. It is inferred that, as a result, the penetration of copper ions into the resist bottom (introduction of sulfuric acid into the resist) would be relatively suppressed.

2. Photosensitive Resin Composition for Production of Plated Shaped Structures

The embodiment of the photosensitive resin composition for the production of plated shaped structures of the present invention is characterized by containing a resin (A) whose solubility in alkali is increased by the action of an acid, a photoacid generator (B), and a compound (C) which is decomposed by the action of an acid to produce a primary or secondary amine.

Each description about the photosensitive resin composition used in the step (1) in the method for producing a plated shaped structure can be applied, as it is, to this photosensitive resin composition for the production of plated shaped structures.

According to the embodiment of the photosensitive resin composition for production of plated shaped structures of the present invention, it is possible to easily form a positive-type resist which can suppress the infusion of the plating material on the substrate. Therefore, it can be used suitably for formation of the resist pattern in the method for producing a plated shaped structure. In particular, it is suitable for production of a plated shaped structure required to be finely processed.

EXAMPLES

Hereinafter, the present invention is specifically explained using examples. Note that the invention is not limited to the following examples. The unit "part(s)" refers to "part(s) by mass", and the unit "%" refers to "% by mass" unless otherwise indicated.

Production of Photosensitive Resin Composition

Examples 1A to 14A and Comparative Examples 1A to 2A

The components in the amounts indicated in the following Table 1 were uniformly mixed, and the resultant mixtures were filtered through a capsule filter (pore diameter: 3 μm) to produce photosensitive resin compositions of Examples 1A to 14A and Comparative Examples 1A to 2A. In addition, the details of each component indicated in Table 1 are as follows.

a1: copolymer having a structural unit represented by the following formula (a1) (Mw: 10,000)

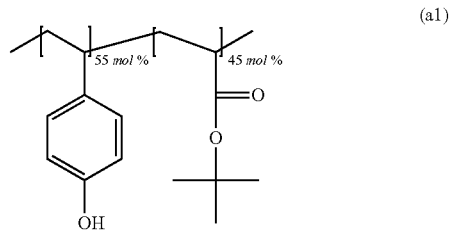

a2: copolymer having a structural unit represented by the following formula (a2) (Mw: 22,000)

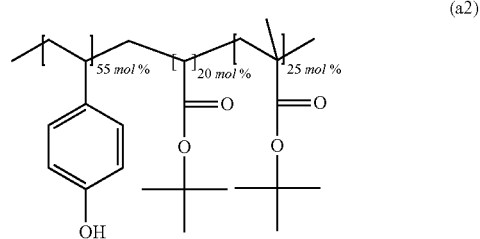

a3: copolymer having a structural unit represented by the following formula (a3) (Mw: 23,000)

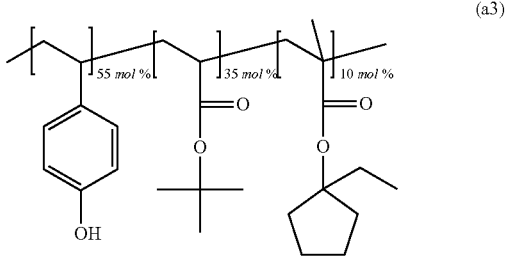

a4: copolymer having a structural unit represented by the following formula (a4) (Mw: 21,000)

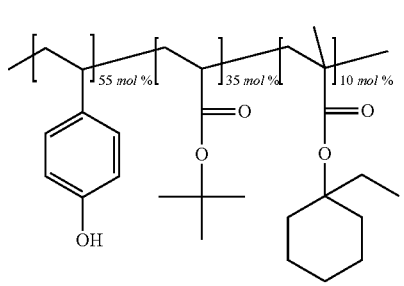
(a4)

a5: copolymer having a structural unit represented by the following formula (a5) (Mw: 22,000)

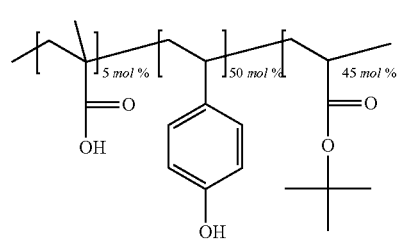
(a5)

a6: copolymer having a structural unit represented by the following formula (a6) (Mw: 20,000)

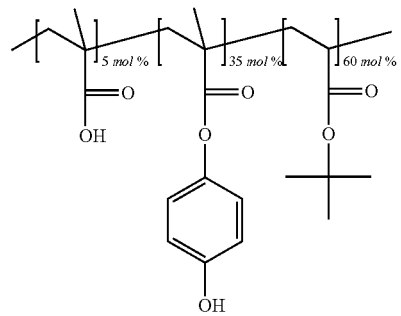
(a6)

a7: copolymer having a structural unit represented by the following formula (a7) (Mw: 16,000)

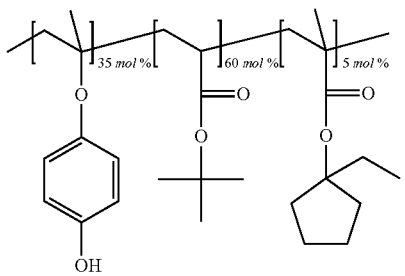
(a7)

a8: copolymer having a structural unit represented by the following formula (a8) (Mw: 15,000)

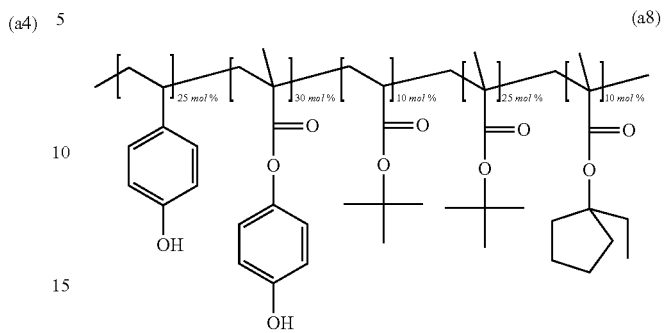
(a8)

a9: copolymer having a structural unit represented by the following formula (a9) (Mw: 15,000)

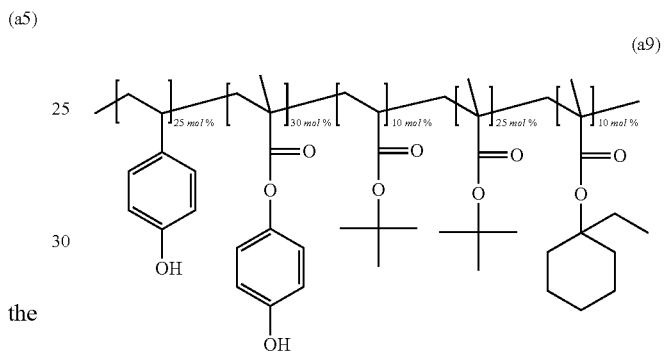
(a9)

a10: copolymer having a structural unit represented by the following formula (a10) (Mw: 48,000)

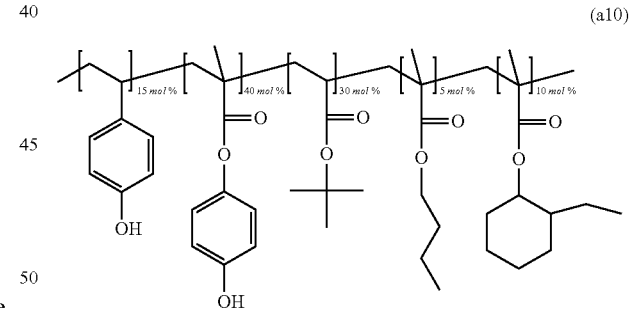
(a10)

a11: copolymer having a structural unit represented by the following formula (a11) (Mw: 35,000)

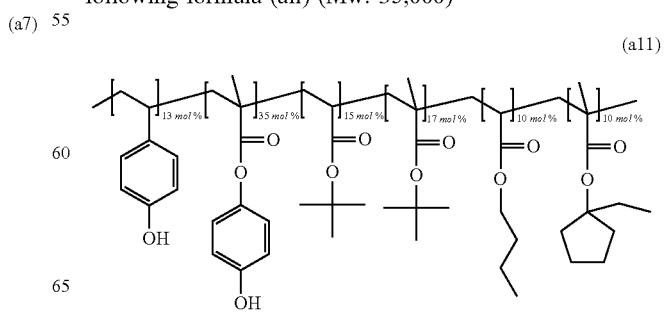
(a11)

b1: N-(trifluoromethylsulfonyloxy)-4-butyl-naphthylimide
c1: compound represented by the following formula (c1)

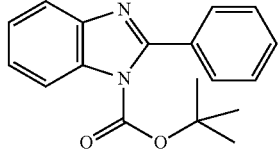
(c1)

c2: compound represented by the following formula (c2)

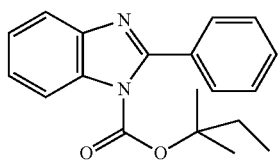
(c2)

c3: compound represented by the following formula (c3)

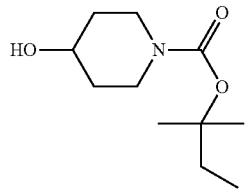
(c3)

c4: compound represented by the following formula (c4)

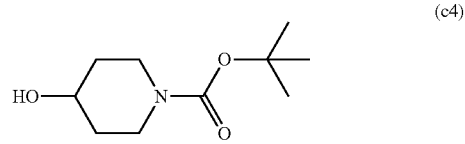
(c4)

c'1: compound represented by the following formula (c'1)

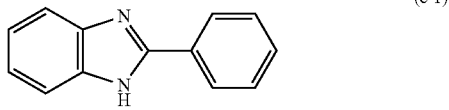
(c'1)

c'2: compound represented by the following formula (c'2)

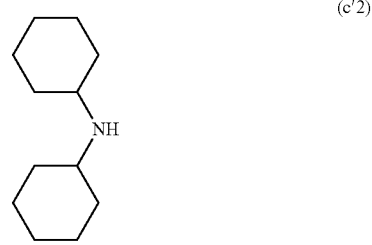 [SMILES: C1CCC(NC2CCCCC2)CC1]
(c'2)

d1: propylene glycol monomethyl ether acetate
d2: diglycerin ethylene oxide (average number of moles of ethylene oxide added: 18) adduct perfluorononenyl ether ("Ftergent FTX-218", manufactured by N cos Co., Ltd.)

TABLE 1

| | a1 | a2 | a3 | a4 | a5 | a6 | a7 | a8 | a9 | a10 | a11 | b1 | c1 | c2 | c3 | c4 | c'1 | c'2 | d1 | d2 |
|---|---|---|---|---|---|---|---|---|---|---|---|---|---|---|---|---|---|---|---|---|
| Example 1A | 100 parts | | | | | | | | | | | 1 part | *1 | | | | | | 230 parts | 0.1 parts |
| Example 2A | 100 parts | | | | | | | | | | | 1 part | | *1 | | | | | 230 parts | 0.1 parts |
| Example 3A | 100 parts | | | | | | | | | | | 1 part | | | *1 | | | | 230 parts | 0.1 parts |
| Example 4A | 100 parts | | | | | | | | | | | 1 part | | | | *1 | | | 230 parts | 0.1 parts |
| Example 5A | | 100 parts | | | | | | | | | | 1 part | | | *1 | | | | 230 parts | 0.1 parts |
| Example 6A | | | 100 parts | | | | | | | | | 1 part | | | *1 | | | | 230 parts | 0.1 parts |
| Example 7A | | | | 100 parts | | | | | | | | 1 part | | | *1 | | | | 230 parts | 0.1 parts |
| Example 8A | | | | | 100 parts | | | | | | | 1 part | | *1 | | | | | 230 parts | 0.1 parts |
| Example 9A | | | | | | 100 parts | | | | | | 1 part | | *1 | | | | | 230 parts | 0.1 parts |
| Example 10A | | | | | | | 100 parts | | | | | 1 part | *1 | | | | | | 230 parts | 0.1 parts |
| Example 11A | | | | | | | | 100 parts | | | | 1 part | | | | *1 | | | 230 parts | 0.1 parts |
| Example 12A | | | | | | | | | 100 parts | | | 1 part | | | | *1 | | | 230 parts | 0.1 parts |
| Example 13A | | | | | | | | | | 100 parts | | 1 part | | | | *1 | | | 230 parts | 0.1 parts |
| Example 14A | | | | | | | | | | | 100 parts | 1 part | *1 | | | | | | 230 parts | 0.1 parts |

TABLE 1-continued

| | a1 | a2 | a3 | a4 | a5 | a6 | a7 | a8 | a9 | a10 | a11 | b1 | c1 | c2 | c3 | c4 | c'1 | c'2 | d1 | d2 |
|---|---|---|---|---|---|---|---|---|---|---|---|---|---|---|---|---|---|---|---|---|
| Comparative Example 1A | 100 parts | | | | | | | | | | | 1 part | | | | | *1 | | 230 parts | 0.1 parts |
| Comparative Example 2A | 100 parts | | | | | | | | | | | 1 part | | | | | | *1 | 230 parts | 0.1 parts |

*1: Amount such that the number of moles is 40 moles with respect to 100 moles of (b1).

Production of Plated Shaped Structure

Example 1B

The photosensitive resin composition of Example 1A produced above was applied onto a copper sputtered film of a substrate in which the copper sputtered film was provided on a silicon wafer, using a spin coater, and heated at a temperature of 110° C. for 60 seconds using a hot plate to form a coating film (1) having a thickness of 6 μm.

The coating film (1) was exposed to light through a pattern mask using a stepper (manufactured by Nikon Corporation, model "NSR-i10D"). The coating film (1) after light exposure so was heated at a temperature of 90° C. for 60 seconds, and then immersed in 2.38% by mass of an aqueous solution of tetramethylammonium hydroxide for 80 seconds to develop the coating film (1), so that a resist pattern (resist width: 2 μm, distance between resist patterns: 2 μm, height: about 6 μm) was formed on the substrate. When the obtained resist pattern was observed with an electron microscope, the longitudinal cross-sectional shape was rectangular.

Subsequently, gold plating was performed using this resist pattern as a mask. As pretreatment before electrolytic plating, ashing treatment with oxygen plasma (output: 100W, oxygen flow rate: 100 ml, treatment time: 60 seconds) was performed. Thereafter, sulfuric acid treatment (contact with 10% by mass of an aqueous sulfuric acid solution for 60 seconds) was followed by water washing. The substrate after the pretreatment was immersed in 1 liter of a cyan gold plating solution (made by Electroplating Engineers of Japan Ltd., trade name: TEMPEREX 401), so that electrolytic plating was performed for about 60 minutes at a plating bath temperature set to 42° C. and a current density set to 0.6 A/dm². After gold plating, the resist pattern was removed with a resist stripping solution to produce a gold-plated shaped structure.

When the gold-plated shaped structure was observed with an electron microscope, no infusion of the gold plating solution was found at the bottom of the resist pattern. Therefore, it was possible to produce a good gold-plated shaped structure (FIGURE).

Comparative Example 1B

A gold-plated shaped structure was produced in the same manner as in Example 1B except that the photosensitive resin composition of Comparative Example 1A was used instead of the photosensitive resin composition of Example 1A. In the gold-plated shaped structure of Comparative Example 1B, traces of infusion of the gold plating solution were found at the bottom of the resist pattern, and the gold-plated shaped structure was thinly formed on the surface of the substrate (FIGURE).

In Comparative Example 1B, when the substrate after the sulfuric acid treatment was observed with an electron microscope, traces of sulfuric acid infusion were found at the bottom of the resist pattern (FIGURE).

Examples 2B to 14B and Comparative Example 2B

In Examples 2B to 14B and Comparative Example 2B, a gold-plated shaped structure was produced in the same manner as in Example 1B except that the photosensitive resin compositions of Examples 2A to 14A and Comparative Example 2A were used instead of the photosensitive resin composition of Example 1A. As a result of observation with an electron microscope, the gold-plated shaped structures of Examples 2B to 14B were good, similarly to the gold-plated shaped structure of Example 1B. On the other hand, in the gold-plated shaped structure of Comparative Example 2B, similarly to in the gold-plated shaped structure of Comparative Example 1B, traces of infusion of the gold plating solution were found at the bottom of the resist pattern, and the gold-plated shaped structure was thinly formed on the surface of the substrate.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for producing a plated shaped structure, comprising:
    applying a photosensitive resin composition on a substrate to form a photosensitive resin coating film, the photosensitive resin composition comprising: (A) a resin whose solubility in alkali is capable of being increased by an action of an acid; (B) a photoacid generator; and (C) a compound which is capable of being decomposed by an action of an acid to form a primary or secondary amine;
    exposing the photosensitive resin coating film to light;
    decomposing the compound (C) to dissociate an acid-dissociable group therein and form a primary or secondary amine in the exposed region;
    developing the photosensitive resin coating film after the exposing to light to form a resist pattern; and
    performing a plating process using the resist pattern as a mask,
    wherein the compound (C) is an amine compound in which the acid-dissociable group is bonded to a nitrogen atom, and
    wherein the plating process is a copper plating process using copper sulfate.

2. The method for producing a plated shaped structure according to claim 1, wherein the resin (A) has a phenolic hydroxyl group.

3. The method for producing a plated shaped structure according to claim 2, wherein the compound (C) is an alkoxycatbonylated amine.

4. The method for producing a plated shaped structure according to claim 3, wherein the alkoxycarbonylated amine is an isopentaoxycarbonylated amine.

5. The method for producing a plated shaped structure according to claim 1, wherein the compound (C) is an alkoxycarbonylated amine.

6. The method for producing a plated shaped structure according to claim 5, wherein the alkoxycarbonylated amine is an isopentaoxycarbonylated amine.

7. The method for producing a plated shaped structure according to claim 1, further comprising removing the resist pattern.

8. The method for producing a plated shaped structure according to claim 1, wherein the compound (C) is selected from the group consisting of N-(alkoxycarbonyl)piperidine, N-(alkoxycarbonyl)-4-hydroxypiperidine, N-(alkoxycarbonyl)imidazole, N-(alkoxycarbonyl)benzimidazole, N-(alkoxycarbonyl)-2-phenylbenzimidazole, N-(alkoxycarbonyl)dioctylamine, N-(alkoxycarbonyl)diethanolamine, N-(alkoxycarbonyl)dicyclohexylamine, and N-(alkoxycarbonyl) diphenylamine.

9. The method for producing a plated shaped structure according to claim 1, wherein the compound (C) is selected from the group consisting of:

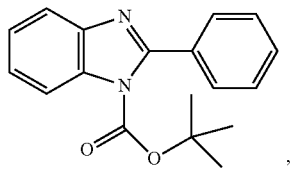

(c1)

,

-continued

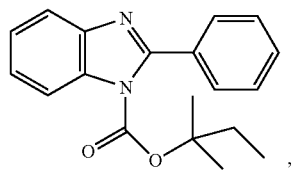

(c2)

,

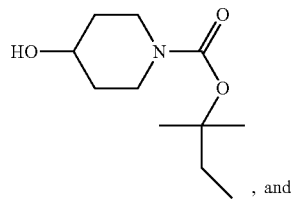

(c3)

, and

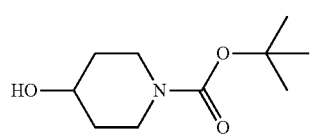

(c4)

.

10. The method for producing a plated shaped structure according to claim 1, wherein when a positive-type resist film is exposed, in the exposed region, dissociation of the acid-dissociable group in the compound (C) caused by the action of the acid forms the primary or secondary amine which leads to an acid diffusion controlling action, and in the non-exposed region, the compound (C) does not undergo the action of the acid and remains in the positive-type resist pattern in a state where the compound (C) still has an acid-dissociable group.

* * * * *